United States Patent
Yu et al.

(10) Patent No.: US 10,177,097 B2
(45) Date of Patent: Jan. 8, 2019

(54) MULTIPLE DRIVER PIN INTEGRATED CIRCUIT STRUCTURE

(71) Applicant: TAIWAN SEMICONDUCTOR MANUFACTURING COMPANY, LTD., Hsinchu (TW)

(72) Inventors: Chih-Yeh Yu, Hsinchu (TW); Wen-Hao Chen, Hsinchu (TW); Yuan-Te Hou, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/922,283

(22) Filed: Mar. 15, 2018

(65) Prior Publication Data
US 2018/0204806 A1 Jul. 19, 2018

Related U.S. Application Data

(63) Continuation of application No. 15/229,264, filed on Aug. 5, 2016, now Pat. No. 9,935,057.

(51) Int. Cl.
| | |
|---|---|
| *H01L 23/552* | (2006.01) |
| *H01L 21/768* | (2006.01) |
| *H01L 27/02* | (2006.01) |
| *H01L 23/522* | (2006.01) |
| *H01L 23/50* | (2006.01) |

(52) U.S. Cl.
CPC ...... *H01L 23/552* (2013.01); *H01L 21/76895* (2013.01); *H01L 23/50* (2013.01); *H01L 23/522* (2013.01); *H01L 23/5226* (2013.01); *H01L 27/0207* (2013.01)

(58) Field of Classification Search
CPC . H01L 51/56; H01L 51/5253; H01L 51/0097; H01L 27/3244; H01L 2227/323
USPC .......................................................... 257/659
See application file for complete search history.

(56) References Cited

U.S. PATENT DOCUMENTS

| | | | |
|---|---|---|---|
| 8,421,205 B2 | 4/2013 | Yang | |
| 8,661,389 B2 | 2/2014 | Chern et al. | |
| 8,698,205 B2 | 4/2014 | Tzeng et al. | |
| 8,826,212 B2 | 9/2014 | Yeh et al. | |
| 8,836,141 B2 | 9/2014 | Chi et al. | |
| 8,875,076 B2 | 10/2014 | Lin et al. | |
| 9,147,029 B2 | 9/2015 | Ke et al. | |
| 9,235,674 B2 | 1/2016 | O'Brien et al. | |
| 9,768,111 B2 * | 9/2017 | O'Brien | H01L 23/5225 |
| 2014/0252644 A1 | 9/2014 | O'Brien et al. | |
| 2014/0264924 A1 | 9/2014 | Yu et al. | |
| 2014/0282289 A1 | 9/2014 | Hsu et al. | |

(Continued)

*Primary Examiner* — Andy Huynh
(74) *Attorney, Agent, or Firm* — Hauptman Ham, LLP

(57) ABSTRACT

An integrated circuit (IC) structure includes a plurality of driver pins, each driver pin positioned at a driver pin level and oriented in a driver pin direction, and a plurality of layers of metal segment arrays. Each layer of metal segment arrays has a layer direction and includes two parallel metal segments oriented in the layer direction. The layer direction of a lowermost layer is perpendicular to the driver pin direction, the layer direction of each additional layer is perpendicular to the layer direction of a layer immediately below the additional layer, and each metal segment of a topmost layer is electrically connected to each driver pin of the plurality of driver pins.

20 Claims, 9 Drawing Sheets

(56) References Cited

U.S. PATENT DOCUMENTS

| | | |
|---|---|---|
| 2015/0279453 A1 | 10/2015 | Fujiwara et al. |
| 2015/0318241 A1 | 11/2015 | Chang et al. |
| 2015/0347659 A1 | 12/2015 | Chiang et al. |
| 2015/0357279 A1 | 12/2015 | Fujiwara et al. |
| 2016/0012169 A1 | 1/2016 | Chiang et al. |

* cited by examiner

MULTIPLE DRIVER PIN INTEGRATED CIRCUIT STRUCTURE

PRIORITY CLAIM

The present application is a continuation of U.S. application Ser. No. 15/229,264, filed Aug. 5, 2016, which is incorporated herein by reference in its entirety.

BACKGROUND

In many integrated circuits (ICs), a net provides an electrical connection between a driver pin and a sink pin located away from the driver pin. A net is often routed using metal layers above the driver pin and the sink pin to avoid other circuit elements between the driver pin and the sink pin.

Because signal delays and susceptibility to electromigration (EM) are both affected by net resistance, nets are sometimes routed using metal widths that are wider than those defined by a set of default rules, thereby reducing net resistance. Such non-default rule (NDR) routing of net components results in increased area requirements as compared to nets routed in accordance with the set of default rules, especially if the NDR routing is applied to an entire net.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1A:
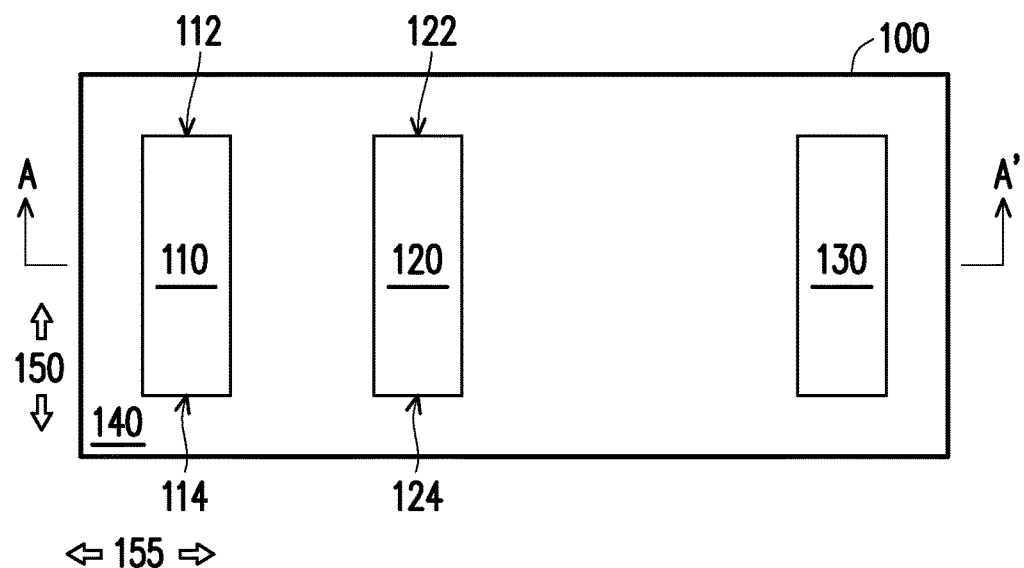
FIGS. 1A and 1B are diagrams of a cell, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

In various embodiments, at least one plurality of driver pins is electrically connected to an IC net structure by a mesh array of metal segments and vias at locations where metal segments of adjacent layers overlap. The mesh array configuration allows the plurality of driver pins to be electrically connected to a sink pin using a relatively low resistance net structure with metal segments having widths based on a set of default rules.

Figure 1B:
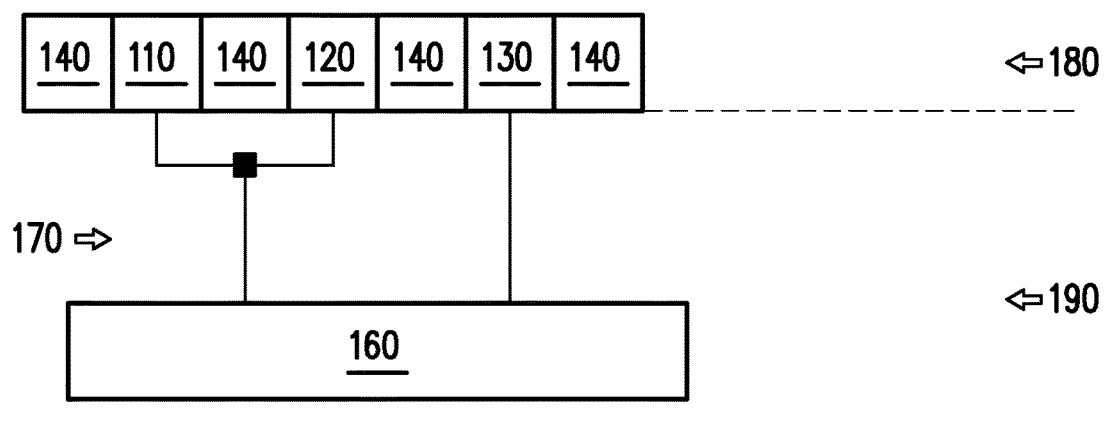

FIGS. 1A and 1B are diagrams of a cell 100, in accordance with some embodiments. FIG. 1A is a diagram based on a top, or plan, view of cell 100, and FIG. 1B is a diagram based on a cross-sectional view of cell 100 along line A-A'. Cell 100 includes a driver pin 110, a driver pin 120, a sink pin 130, a dielectric 140, one or more functional circuit elements 160, and functional circuit connections 170. A driver pin direction 150 and an alignment direction 155 perpendicular to driver pin direction 150 are indicated in FIG. 1A.

As shown in FIG. 1B, driver pins 110 and 120, sink pin 130, and dielectric 140 are positioned at a driver pin level 180, and the one or more functional circuit elements 160 and functional circuit connections 170 are positioned at a functional circuit level 190 below driver pin level 180.

Driver pin level 180 is a portion of an IC positioned above a substrate (not shown) and below one or more metal interconnect layers. Driver pin level 180 includes one or more metal layers and one or more dielectric layers configured to provide electrical connections between the substrate and overlying metal interconnects. In some embodiments, driver pin level 180 includes one or more via layers. In some embodiments, driver pin level 180 includes a metal one layer of an IC process. In some embodiments, driver pin level 180 includes a metal two layer of an IC process.

Functional circuit level 190 is a portion of an IC that includes the substrate and features formed on and/or in the substrate and configured to form functional devices. Functional circuit level 190 includes one or more conductive layers and one or more dielectric layers. The one or more conductive layers include one or more of a metal layer or a polysilicon layer.

In some embodiments, cell 100 is a modular component of an IC (not shown). In some embodiments, cell 100 represents another portion of an IC that has driver pins 110 and 120 at driver pin level 180.

Driver pin 110 and driver pin 120 are electrically conductive line segments positioned in parallel at driver pin level 180 and oriented in driver pin direction 150. Driver pin 110 comprises a first endpoint 112 and a second endpoint 114, and driver pin 120 comprises a first endpoint 122 and a second endpoint 124. In some embodiments, endpoints 112 and 122 align with each other in alignment direction 155. In some embodiments, endpoints 114 and 124 align with each other in alignment direction 155. In some embodiments, neither of endpoints 112 and 122 nor endpoints 114 and 124 align with each other in alignment direction 155.

Driver pin 110 and driver pin 120 are also described as a plurality of driver pins. In some embodiments, a plurality of driver pins includes only driver pin 110 and driver pin 120. In some embodiments, a plurality of driver pins includes one or more driver pins (not shown) in addition to driver pin 110 and driver pin 120.

Each of driver pin 110 and driver pin 120 comprises a conductive material such as a metal, a metal composite, or other suitable material that is formed in one or more metallization layers by one or more of a physical vapor deposition process, a chemical vapor deposition process, a plating process, or other suitable process.

Sink pin 130 is an electrically conductive line segment oriented in driver pin direction 150. In some embodiments, sink pin 130 is oriented in alignment direction 155. Sink pin 130 comprises a conductive material such as a metal, a metal composite, or other suitable material that is formed in one or more metallization layers by one or more of a physical vapor deposition process, a chemical vapor deposition process, a plating process, or other suitable process.

In some embodiments, cell 100 includes driver pin 110 and driver pin 120 but does not include sink pin 130. In some embodiments, cell 100 includes sink pin 130 but does not include driver pin 110 or driver pin 120.

Dielectric 140 surrounds driver pin 110, driver pin 120, and sink pin 130 at driver pin level 180 such that each of driver pin 110, driver pin 120, and sink pin 130 is electrically isolated from the other two of driver pin 110, driver pin 120, and sink pin 130 at driver pin level 180. In some embodiments, dielectric 140 does not completely surround driver pin 110 and driver pin 120 such that an electrical connection (not shown) exists between driver pin 110 and driver pin 120 at driver pin level 180.

The one or more functional circuit elements 160 include a transistor, diode, resistor, inductor, capacitor, or other suitable device, or a combination of one or more such devices. In some embodiments, driver level 190 includes all or a portion of a substrate on which the one or more functional circuit elements 160 are formed.

Functional circuit connections 170 electrically connect the one or more functional circuit elements 160 to each of driver pin 110, driver pin 120, and sink pin 130. In various embodiments, functional circuit connections 170 include one or more of a via structure, a conductive line, a contact plug, or other suitable structural element. Functional circuit connections 170 comprise one or a combination of a conductive material such as polysilicon, a metal, a metal composite, or other suitable material that is formed by one or more of a physical vapor deposition process, a chemical vapor deposition process, a plating process, or other suitable process.

The one or more functional circuit elements 160 and functional circuit connections 170 are configured so that, in operation, a signal generated by the one or more functional circuit elements 160 is output from cell 100 via the parallel path of driver pin 110 and driver pin 120.

Figure 2A:
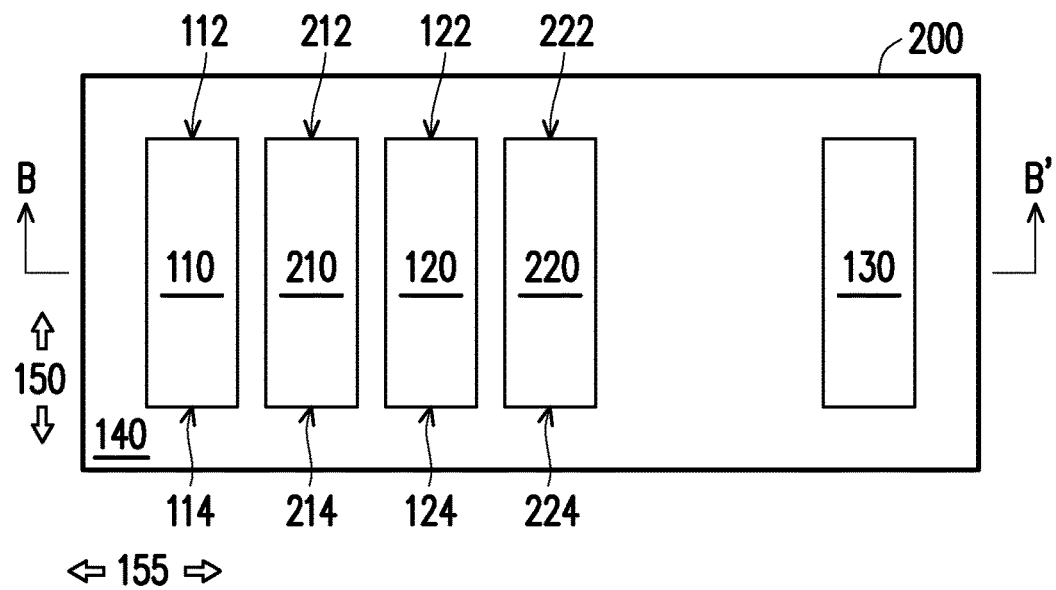
FIGS. 2A and 2B are diagrams of a cell, in accordance with some embodiments.
Figure 2B:
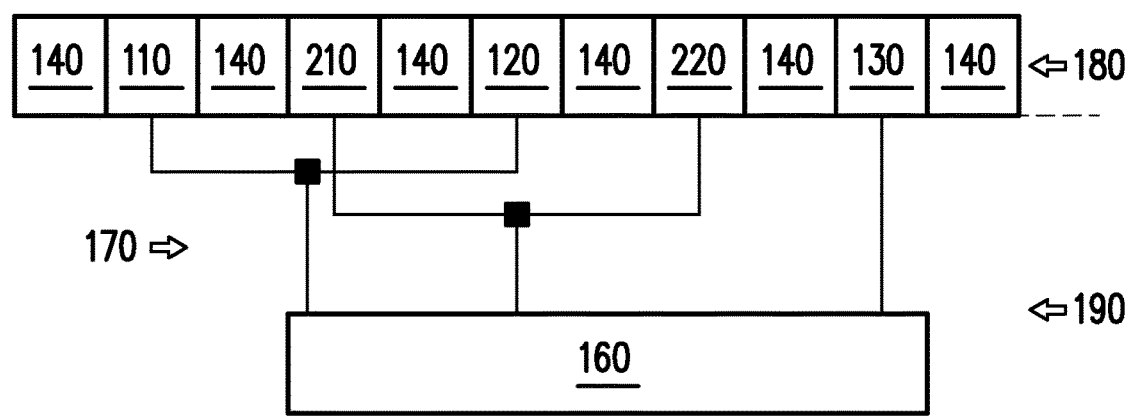

FIGS. 2A and 2B are diagrams of a cell 200, in accordance with some embodiments. Cell 200 includes the elements of cell 100, as described above with respect to FIGS. 1A and 1B. In addition to the elements of cell 100, cell 200 includes driver pin 210 and driver pin 220. FIG. 2A is a diagram based on a top, or plan, view of elements of cell 200 present at driver pin level 180, and FIG. 2B is a diagram based on a cross-sectional view of cell 200 along line B-B'. Driver pin direction 150 and alignment direction 155 are indicated in FIG. 2A. In some embodiments, cell 200 is a modular component of an IC (not shown). In some embodiments, cell 200 represents another portion of an IC that has driver pins 110, 120, 210, and 220 at driver pin level 180.

Driver pin 210 and driver pin 220 are conductive line segments positioned in parallel at driver pin level 180 and oriented in driver pin direction 150. Driver pin 210 comprises a first endpoint 212 and a second endpoint 214, and driver pin 220 comprises a first endpoint 222 and a second endpoint 224. In some embodiments, endpoints 212 and 222 align in alignment direction 155. In some embodiments, endpoint 214 and 224 align in alignment pin direction 155. In some embodiments, neither of endpoints 212 and 222 nor endpoints 214 and 224 align in alignment direction 155.

In some embodiments, endpoints 112, 122, 212 and 222 align in alignment direction 155. In some embodiments, endpoints 114, 124, 214 and 224 align in alignment direction 155. In some embodiments, in alignment direction 155, endpoints 112 and 122 align with each other, endpoints 212 and 222 align with each other, but endpoints 112 and 122 do not align with endpoints 212 and 222. In some embodiments, in alignment direction 155, endpoints 114 and 124 align with each other, endpoints 214 and 224 align with each other, but endpoints 114 and 124 do not align with endpoints 214 and 224.

Driver pin 110 and driver pin 120 are also described as a first plurality of driver pins, and driver pin 210 and driver pin 220 are also described as a second plurality of driver pins. In some embodiments, a first plurality of driver pins includes only driver pin 110 and driver pin 120. In some embodiments, a first plurality of driver pins includes one or more driver pins (not shown) in addition to driver pin 110 and driver pin 120. In some embodiments, a second plurality of driver pins includes only driver pin 210 and driver pin 220. In some embodiments, a second plurality of driver pins includes one or more driver pins (not shown) in addition to driver pin 210 and driver pin 220.

Each of driver pin 210 and driver pin 220 comprises a conductive material such as a metal, a metal composite, or other suitable material that is formed in one or more metallization layers by one or more of a physical vapor deposition process, a chemical vapor deposition process, a plating process, or other suitable process.

In some embodiments, in addition to the configuration discussed above with respect to cell 100, dielectric 140 surrounds driver pin 210 and driver pin 220 at driver pin level 180 such that each of driver pin 210 and driver pin 220 is electrically isolated from each of the other elements at driver pin level 180. In some embodiments, dielectric 140 does not completely surround driver pin 210 and driver pin 220 such that an electrical connection (not shown) exists between driver pin 210 and driver pin 220 at driver pin level 180.

In some embodiments, in addition to the electrical connections discussed above with respect to cell 100, functional circuit connections 170 electrically connect the one or more functional circuit elements 160 to each of driver pin 210 and driver pin 220, as depicted in FIG. 2B. Functional circuit connections 170 are configured such that the connections between the one or more functional circuit elements 160 and driver pins 110 and 120 are electrically isolated from the connections between the one or more functional circuit elements 160 and driver pins 210 and 220.

The one or more functional circuit elements 160 and functional circuit connections 170 are configured so that, in operation, a first signal generated by the one or more functional circuit elements 160 is output from cell 200 via the parallel path of driver pin 110 and driver pin 120, and a second signal, separate from the first signal, generated by the one or more functional circuit elements 160 is output from cell 200 via the parallel path of driver pin 210 and driver pin 220.

Figure 3:
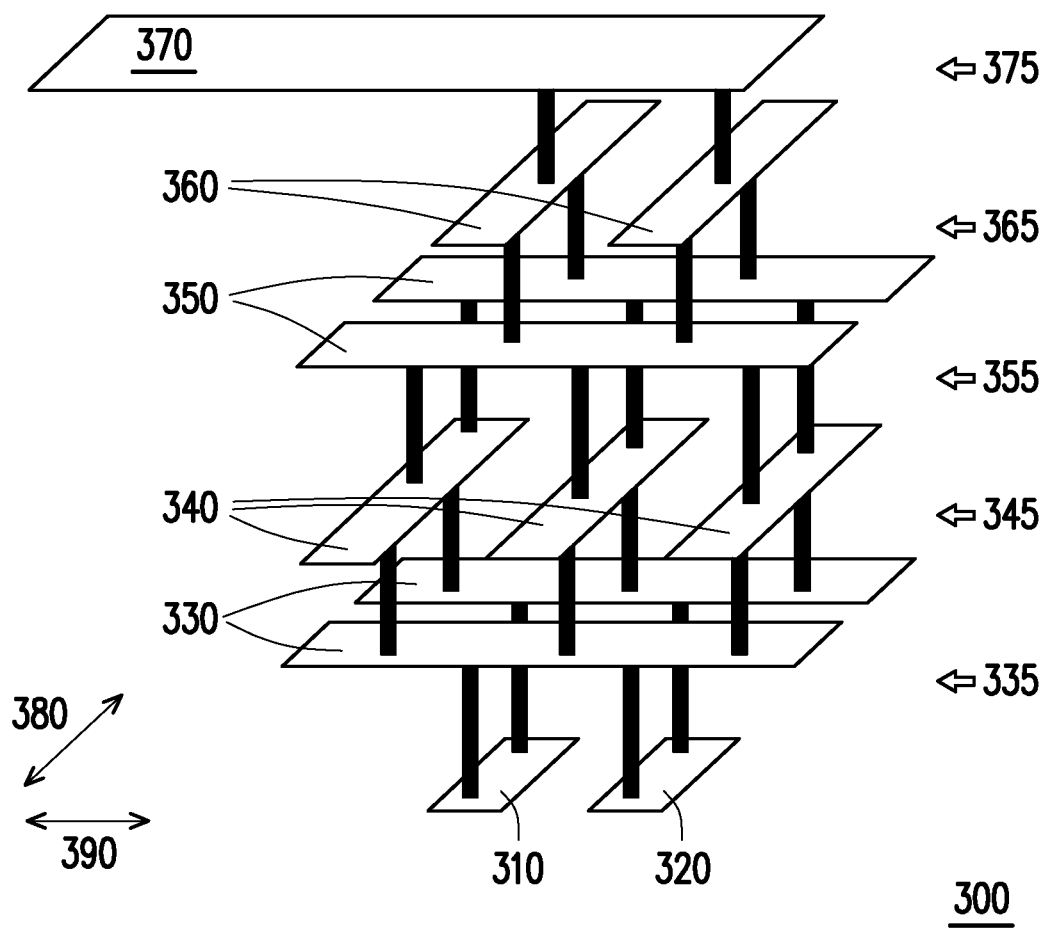
FIG. 3 is a diagram of an IC structure, in accordance with some embodiments.

FIG. 3 is a diagram of an IC structure 300, in accordance with some embodiments. IC structure 300 includes a driver pin 310, a driver pin 320, a first layer of metal segments 330 overlying a first via array 335, a second layer of metal segments 340 overlying a second via array 345, a third layer of metal segments 350 overlying a third via array 355, a fourth layer of metal segments 360 overlying a fourth via array 365, and a routing line 370 overlying a pair of top level vias 375. A first direction 380 and a second direction 390 perpendicular to first direction 380 are indicated in FIG. 3.

Driver pins 310 and 320 are conductive line segments positioned in parallel at a same IC level and oriented in a driver pin direction equivalent to first direction 380. In some embodiments, driver pins 310 and 320 oriented in first direction 380 are driver pins 110 and 120, discussed above with respect to FIGS. 1A and 1B, positioned in parallel at driver pin level 180 above functional circuit level 190, and oriented in driver pin direction 150. In some embodiments, IC structure 300 includes one or more driver pins (not shown) in addition to driver pins 310 and 320.

First layer of metal segments 330 includes two parallel metal segments oriented in second direction 390. The two parallel metal segments of first layer of metal segments 330 overlie driver pins 310 and 320 and overlap driver pins 310 and 320 at four locations.

First via array 335 includes four vias, one via at each of the four locations at which the two parallel metal segments of first layer of metal segments 330 overlap driver pins 310 and 320.

Second layer of metal segments 340 includes three parallel metal segments oriented in first direction 380. The three parallel metal segments of second layer of metal segments 340 overlie the first layer of metal segments 330 and overlap the two parallel metal segments of first layer of metal segments 330 at six locations.

Second via array 345 includes six vias, one via at each of the six locations at which the three parallel metal segments of second layer of metal segments 340 overlap the two parallel metal segments of first layer of metal segments 330.

Third layer of metal segments 350 includes two parallel metal segments oriented in second direction 390. The two parallel metal segments of third layer of metal segments 350 overlie the second layer of metal segments 340 and overlap the three parallel segments of second layer of metal segments 340 at six locations.

Third via array 355 includes six vias, one via at each of the six locations at which the two parallel metal segments of third layer of metal segments 350 overlap the three parallel metal segments of second layer of metal segments 340.

Fourth layer of metal segments 360 includes two parallel metal segments oriented in first direction 380. The two parallel metal segments of fourth layer of metal segments 360 overlie the third layer of metal segments 350 and overlap the two parallel segments of third layer of metal segments 350 at four locations.

Fourth via array 365 includes four vias, one via at each of the four locations at which the two parallel metal segments of fourth layer of metal segments 360 overlap the two parallel metal segments of third layer of metal segments 350.

First layer of metal segments 330, second layer of metal segments 340, third layer of metal segments 350, and fourth layer of metal segments 360 are also described as a plurality of layers of metal segment arrays. In some embodiments, a plurality of layers of metal segment arrays includes fewer than the four layers of the embodiment depicted in FIG. 3. In some embodiments, a plurality of layers of metal segment arrays includes one or more layers (not shown) in addition to the four layers of the embodiment depicted in FIG. 3.

Each layer of the plurality of layers of metal segment arrays has a layer direction that is one of first direction 380 or second direction 390. The layer direction of the lowermost layer of the plurality of layers of metal segment arrays has a layer direction perpendicular to the driver pin direction. In the embodiment depicted in FIG. 3, first layer of metal segments 330 having a layer direction of second direction 390, perpendicular to the driver pin direction of first direction 380 is an example of the lowermost layer of the plurality of layers of metal segment arrays.

Each layer of the plurality of layers of metal segment arrays above the lowermost layer is an additional layer. Each given additional layer has a layer direction perpendicular to a layer direction of the layer immediately below the given additional layer. Each layer of the plurality of layers of metal segment arrays is thereby configured to have a layer direction perpendicular to the layer direction of each immediately adjacent layer. In the embodiment depicted in FIG. 3, second layer of metal segments 340 is an example of an additional layer having a layer direction of first direction 380, perpendicular to second direction 390, the layer direction of first layer of metal segments 330 immediately below second layer of metal segments 340.

In some embodiments, one or more layers of a plurality of layers of metal segment arrays includes greater or fewer parallel metal segment than the number of parallel segments of the embodiment depicted in FIG. 3. In some embodiments, one or more layers of a plurality of layers of metal segment arrays includes a single metal segment in a layer direction. In some embodiments, one or more layers of a plurality of layers of metal segment arrays includes three or more parallel metal segments in a layer direction.

First via array 335, second via array 345, third via array 355, and fourth via array 365 are also described as a plurality of via arrays. In some embodiments, a plurality of via arrays includes fewer than the four via arrays of the embodiment depicted in FIG. 3. In some embodiments, a plurality of via arrays includes one or more via arrays (not shown) in addition to the four via arrays of the embodiment depicted in FIG. 3.

Each via array includes vias positioned at locations where metal segments of a corresponding overlying layer of the plurality of layers of metal segment arrays overlap metal segments at the level below the via array. The via array corresponding to the lowermost layer includes vias positioned at locations where metal segments of the lowermost layer overlap the driver pins. Each via array corresponding to an additional layer includes vias positioned at locations where metal segments of the additional layer overlap the parallel metal segments of the layer immediately below the additional layer. The plurality of via arrays is thereby configured to include via arrays between each layer of the plurality of layers of metal segment arrays and each immediately adjacent layer.

In some embodiments, one or more via arrays includes vias positioned at every location where a metal segment of a corresponding overlying layer overlaps a metal segment at the level below the via array. In the embodiment depicted in FIG. 3, first via array 335, including four vias located at the four locations where the two metal segments of corresponding overlying first layer of metal segments 330 overlap driver pins 310 and 320, is an example in which a via is present at every location of overlap.

In some embodiments, one or more via arrays includes vias at a subset of the locations where metal segments of a corresponding overlying layer overlap metal segments at the level below the via array. As a non-limiting example, in some embodiments, a via array corresponding to a lowermost layer of a plurality of layers of metal segment arrays includes two vias, one via at each location where a single metal segment of the lowermost layer overlaps each of two driver pins.

In some embodiments, a via positioned at a location where a metal segment of a corresponding overlying layer overlaps a metal segment at the level below the via array is the only via at the location of the overlap. In some embodiments, a via positioned at a location where a metal segment of a corresponding overlying layer overlaps a metal segment at the level below the via array is one via of a plurality of vias at the location of the overlap. In some embodiments, no via is positioned at a location where a metal segment of a corresponding overlying layer overlaps a metal segment at the level below the via array.

Routing line 370 is a single line including a metal segment oriented in second direction 390 at a top level overlying fourth layer of metal segments 360. Additional portions of routing layer 370 are not shown in FIG. 3. Fourth layer of metal segments 360 has a layer orientation of first direction 380, so the metal segment of routing line 370 is oriented in a direction perpendicular to the layer direction of fourth layer of metal segments 360. The pair of top level vias 375 is positioned at the two locations where routing line 370 overlaps the two parallel metal segments of fourth layer of metal segments 360.

In the embodiment depicted in FIG. 3, fourth layer of metal segments 360 is a topmost layer of a plurality of layers of metal segment arrays and routing line 370 overlies the topmost layer of the plurality of layers of metal segment arrays. In some embodiments, a plurality of layers of metal segment arrays includes fewer or more than four layers, and a layer other than the fourth layer is the topmost layer of the plurality of layers of metal segment arrays.

In some embodiments, including the embodiment depicted in FIG. 3, a plurality of layers of metal segment arrays includes an even number of layers, and a routing line is oriented in a direction perpendicular to a driver pin direction. In some embodiments, a plurality of layers of metal segment arrays includes an odd number of layers, and a routing line is oriented in a driver pin direction.

In some embodiments, driver pins 310 and 320 have a width defined by a set of default rules. In some embodiments, driver pins 310 and 320 have a width that is a minimum width defined by a set of default rules.

In some embodiments, each metal segment of a plurality of layers of metal segment arrays has a width defined by a set of default rules. In some embodiments, each metal segment of a plurality of layers of metal segment arrays has a width that is a minimum width defined by a set of default rules.

In some embodiments, a routing line has a width wider than a width defined by a set of default rules. In some embodiments, a routing line has a width wider than a minimum width defined by a set of default rules.

In the various embodiments discussed above, a plurality of layers of metal segment arrays, a plurality of via arrays, and a pair of top level vias are configured to electrically connect a plurality of driver pins to a routing line.

Figure 4A:
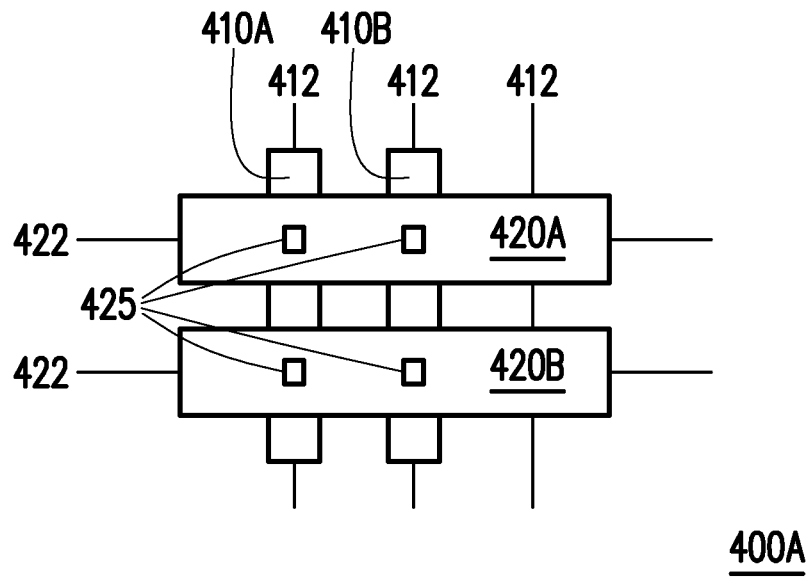
FIGS. 4A and 4B are diagrams of IC structures, in accordance with some embodiments.

FIG. 4A is a diagram of an IC structure 400A, usable as a portion of IC structure 300, discussed above with respect to FIG. 3, in accordance with some embodiments. IC structure 400A includes a metal segment 410A positioned in parallel with a metal segment 410B in a first layer of a plurality of layers of metal segment arrays, a metal segment 420A positioned in parallel with a metal segment 420B in a second layer of the plurality of layers of metal segment arrays overlying the first layer, and a via array 425 including a single via positioned at each location where metal segments 420A and 420B overlap metal segments 410A and 410B.

In some embodiments, metal segments 410A and 410B are driver pins positioned in a driver pin layer. In some embodiments, metal segments 410A and 410B are driver pins 110 and 120 of cell 100, discussed above with respect to FIGS. 1A and 1B. In some embodiments, metal segments 410A and 410B are driver pins 210 and 220 of cell 200, discussed above with respect to FIGS. 2A and 2B.

In some embodiments, metal segments 410A and 410B are positioned in a first layer of a plurality of layers of metal segment arrays that is the lowermost layer of the plurality of layers of metal segment arrays. In some embodiments, metal segments 410A and 410B are positioned in a first layer of a plurality of layers of metal segment arrays that is an additional layer above the lowermost layer of the plurality of layers of metal segment arrays.

Each of metal segments 410A and 410B is positioned along a track 412, and each of metal segments 420A and 420B is positioned along a track 422. Tracks 412 are perpendicular to tracks 422. In the embodiment depicted in FIG. 4A, metal segments 410A and 410B are positioned on adjacent tracks 422.

Each of metal segments 410A and 410B has a width that is a minimum width defined by a set of default rules for the layer in which metal segments 410A and 410B are positioned. Each of metal segments 420A and 420B has a width that is a minimum width defined by a set of default rules for the layer in which metal segments 420A and 420B are positioned.

Figure 4B:
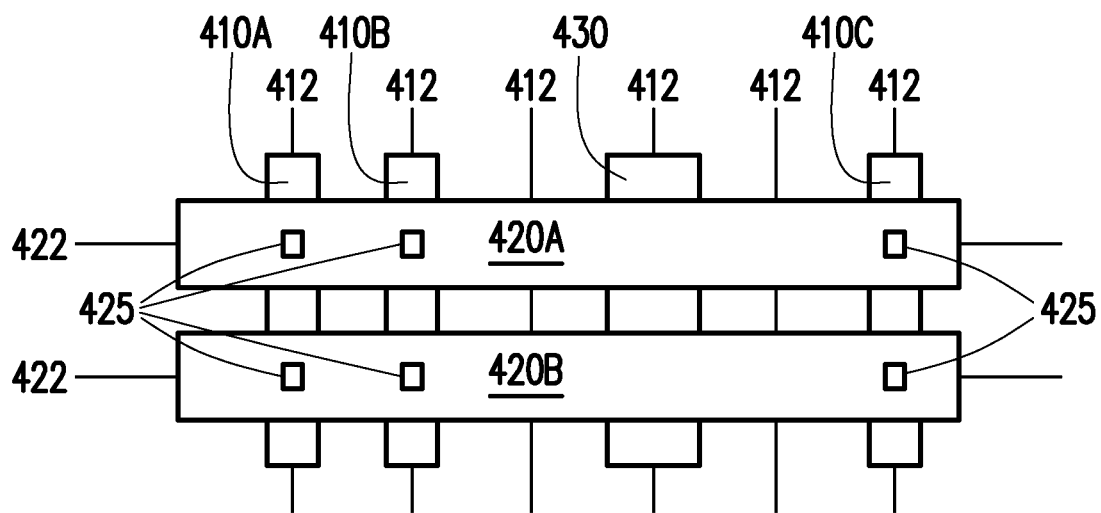

FIG. 4B is a diagram of an IC structure 400B, usable as a portion of IC structure 300, discussed above with respect to FIG. 3, in accordance with some embodiments. IC structure 400B includes the elements of IC structure 400A, as described above with respect to FIG. 4A. In addition to the elements of IC structure 400A, IC structure 400B includes a metal segment 410C and a metal line 430 in parallel with, and in the same layer as, metal segments 410A and 410B.

Metal line 430 includes a metal segment between metal segments 410B and 410C as depicted in FIG. 4B. Additional portions of metal line 430 are not shown in FIG. 4B. Metal line 430 is electrically isolated from metal segments 410A, 410B, 410C, 420A, and 420B, and via array 425.

Metal line 430 is positioned on a track 412. In some embodiments, metal line 430 has a width wider than a minimum width defined by a set of default rules for the layer in which metal segments 410A, 410B, and 410C and metal line 430 are positioned.

Metal segments 410B and 410C are positioned on tracks 412 that are not adjacent to the track 412 on which metal line 430 is positioned. In some embodiments, the positioning of metal segment 410B and metal line 430 on non-adjacent tracks 412 causes the distance between metal segment 410B and metal line 430 to be greater than a minimum separation distance defined by a set of default rules for the layer in which metal segments 410A, 410B, and 410C and metal line 430 are positioned. In some embodiments, the positioning of metal segment 410C and metal line 430 on non-adjacent tracks 412 causes the distance between metal segment 410C and metal line 430 to be greater than a minimum separation distance defined by a set of default rules for the layer in which metal segments 410A, 410B, and 410C and metal line 430 are positioned.

Each of metal segments 420A and 420B overlaps each of metal segments 410A, 410B, and 410C and metal line 430. Via array 425 includes vias positioned at locations where metal segments 420A and 420B overlap metal segments 410A, 410B, and 410C. In some embodiments, vias of via array 425 are positioned at every location where metal segments 420A and 420B overlap metal segments 410A, 410B, and 410C. In some embodiments, vias of via array 425 are positioned at a subset of the locations where metal segments 420A and 420B overlap metal segments 410A, 410B, and 410C. Vias of via array 425 are not positioned at locations where metal segments 420A and 420B overlap metal line 430.

Figure 5:
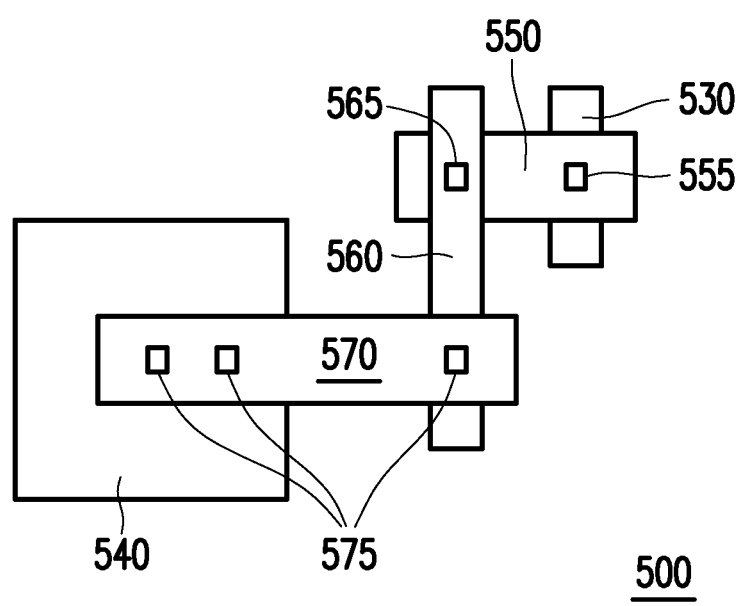
FIG. 5 is a diagram of a net structure, in accordance with some embodiments.

FIG. 5 is a diagram of a net structure 500, in accordance with some embodiments. Net structure 500 is an IC structure that includes a sink pin 530, a mesh array 540, a first metal segment 550 overlying sink pin 530, a second metal segment 560 overlying first metal segment 550, and a routing line 570. A first via 555 is positioned at a location where first metal segment 550 overlaps sink pin 530, a second via 565 is positioned at a location where second metal segment 560 overlaps first metal segment 550, and a plurality of vias 575 are positioned at locations where routing line 570 overlaps second metal segment 560 and where routing line 570 overlaps metal segments in a topmost layer of mesh array 540.

Sink pin 530 is a metal segment oriented in a sink pin direction (not shown). In some embodiments, sink pin 530 is sink pin 130 of a cell 100, discussed above with respect to FIGS. 1A and 1B. In some embodiments, sink pin 530 is sink pin 130 of a cell 200, discussed above with respect to FIGS. 2A, and 2B. In some embodiments, sink pin 530 is a metal segment at a same level of a driver pin of an IC. In some embodiments, sink pin 530 is a metal segment at a level of an IC different from a level of a driver pin of the IC.

Mesh array 540 is an IC structure comprising a plurality of driver pins, a plurality of layers of metal segment arrays, and a plurality of via arrays, as discussed above with respect to a cell 100, a cell 200, an IC structure 300, an IC structure 400A, and an IC structure 400B, and as discussed below with respect to an IC structure 600. Mesh array 540 is configured to electrically connect a plurality of driver pins to a plurality of metal segments at a topmost layer of mesh array 540.

First metal segment 550 is positioned in a layer overlying sink pin 530 and having an orientation in a direction perpendicular to the sink pin direction. First metal segment 550 overlaps sink pin 530, and first via 555 is positioned at the location where first metal segment 550 overlaps sink pin 530.

Second metal segment 560 is positioned in a layer overlying first metal segment 550 and having an orientation in a direction perpendicular to the direction in which first metal segment 550 is oriented. Second metal segment 560 overlaps first metal segment 550, and second via 565 is positioned at the location where second metal segment 560 overlaps first metal segment 550.

Routing line 570 is positioned in a layer overlying second metal segment 560 and having an orientation in a direction perpendicular to the direction in which second metal segment 560 is oriented. The layer in which routing line 570 is positioned also overlies the plurality of metal segment arrays at the topmost layer of mesh array 540, and routing line 570 has an orientation in a direction perpendicular to the direction in which the metal segment array at the topmost layer of mesh array 540 is oriented.

The plurality of vias 575 are positioned at locations where routing line 570 overlaps second metal segment 560 and the metal segment array at the topmost layer of mesh array 540.

In the embodiment depicted in FIG. 5, first metal segment 550 and second metal segment 560 are positioned at layers of a plurality of layers of metal segments configured to electrically connect routing line 570 to sink pin 530. In the embodiment depicted in FIG. 5, a plurality of layers of metal segments includes two layers, and metal segment 560 is positioned at a topmost layer of the plurality of layers of metal segments. In some embodiments, a plurality of layers of metal segments includes fewer or more than two layers, and a layer other than the second layer is the topmost layer of the plurality of layers of metal segments.

In the embodiment depicted in FIG. 5, routing line 570 comprises a single metal segment having a single orientation direction, and the single metal segment overlaps both mesh array 540 and second metal segment 560 of the topmost layer of the plurality of layers of metal segments. In some embodiments, routing line 570 has a configuration different from the configuration depicted in FIG. 5. In some embodiments, a mesh array and plurality of driving pins are separated from a sink pin by a significant distance and routing line 570 includes features in addition to the single metal segment depicted in FIG. 5.

In some embodiments, routing line 570 comprises a plurality of metal segments having a plurality of orientation directions. In some embodiments, routing line 570 comprises a first metal segment that overlaps a metal segment of a topmost layer of a plurality of metal segments, and a second metal segment that overlaps a plurality of metal segments at the topmost layer of a mesh array, and the first metal segment and the second metal segment have a same orientation direction. In some embodiments, routing line 570 comprises a first metal segment that overlaps a metal segment of a topmost layer of a plurality of metal segments, and a second metal segment that overlaps a plurality of metal segments at the topmost layer of a mesh array, and the first metal segment and the second metal segment have different orientation directions.

Sink pin 530, mesh array 540, first metal segment 550, first via 555, second metal segment 560, second via 565, routing line 570, and plurality of vias 575 are configured to electrically connect a plurality of driver pins to sink pin 530.

In some embodiments, each metal segment of sink pin 530, mesh array 540, first metal segment 550, and second metal segment 560 has a width defined by a set of default rules. In some embodiments, each metal segment of sink pin 530, mesh array 540, first metal segment 550, and second metal segment 560 has a width that is a minimum width defined by a set of default rules.

In some embodiments, routing line 570 has a width wider than a width defined by a set of default rules. In some embodiments, routing line 570 has a width wider than a minimum width defined by a set of default rules.

A net in which a mesh array based on minimum width metal segments provides electrical connections for a plurality of driver pins has a lower resistance than a net in which single metal segments provide electrical connections for a single driver pin. By reducing current densities, a net in which a mesh array based on minimum width metal segments provides electrical connections for a plurality of driver pins also has a reduced susceptibility to EM compared to a net in which single metal segments provide electrical connections for a single driver pin.

A net in which a mesh array based on minimum width metal segments provides electrical connections for a plurality of driver pins has smaller area requirements than a net in which single metal segments having widths wider than widths defined by a set of default rules provide electrical connections for a single driver pin. The smaller area requirements have increased significance in comparison to a net in which all metal segments throughout the net have widths defined by a single set of non-default rules such that all metal segments of a given layer have a same width wider than a minimum width for that layer.

Figure 6:
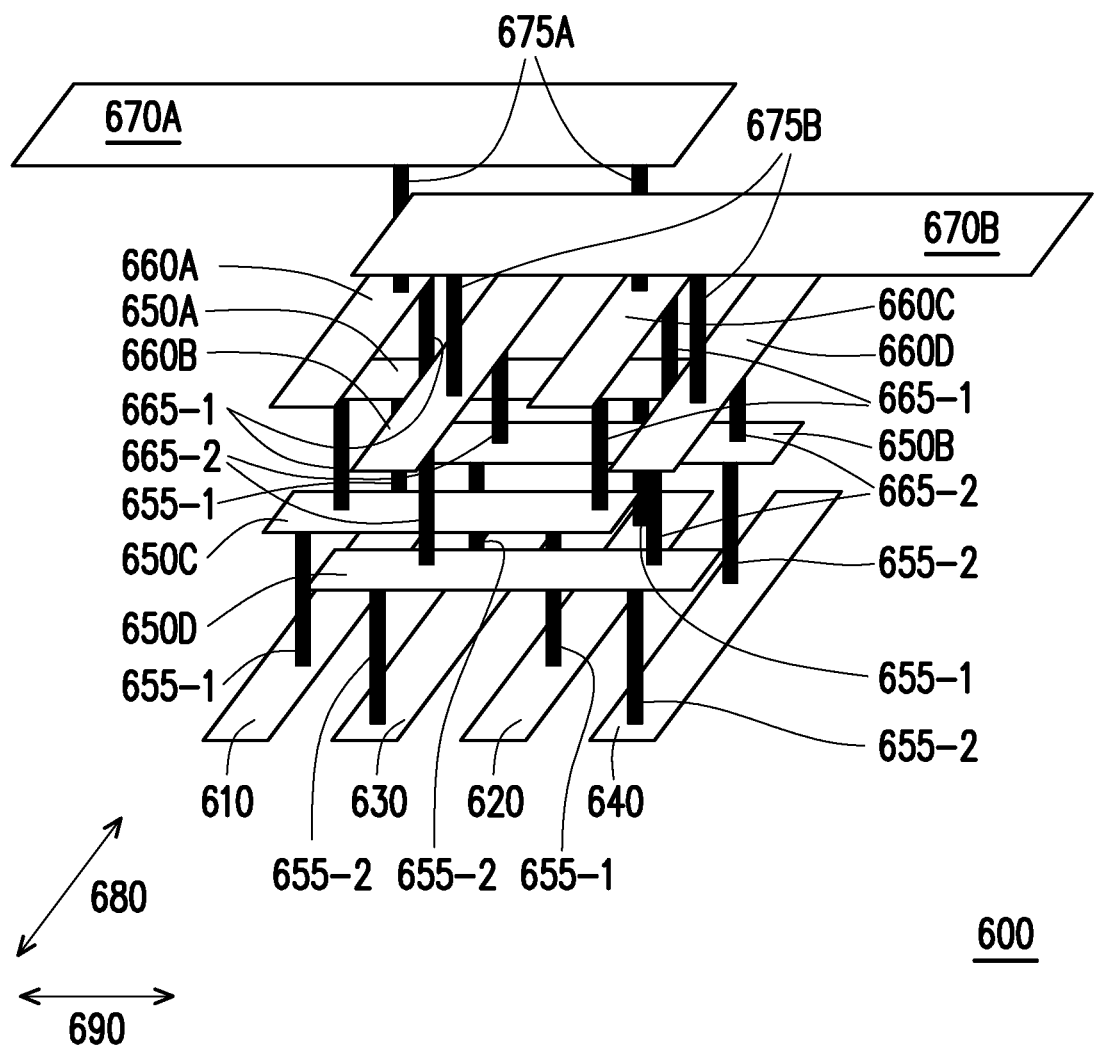
FIG. 6 is a diagram of an IC structure, in accordance with some embodiments.

FIG. 6 is a diagram of an IC structure 600, in accordance with some embodiments. IC structure 600 includes driver pins 610, 620, 630, and 640, a first layer of metal segments 650A, 650B, 650C, and 650D, depicted in FIG. 6 from back to front, respectively, overlying first via arrays 655-1 and 655-2, a second layer of metal segments 660A, 660B, 660C, and 660D, depicted in FIG. 6 from left to right, respectively, overlying second via arrays 665-1 and 665-2, a first routing line 670A overlying a first pair of top level vias 675A, and a second routing line 670B overlying a second pair of top level vias 675B. A first direction 680 and a second direction 690 perpendicular to first direction 680 are indicated in FIG. 6.

IC structure 600 has a configuration similar to that of IC structure 300 and includes the features of IC structure 300, discussed above with respect to FIG. 3. In addition, as discussed below, IC structure 600 includes features in accordance with driver pin configurations as described above with respect to cell 200 and FIGS. 2A and 2B, in which a driver pin level includes a first plurality of driver pins and a second plurality of driver pins.

Driver pins 610, 620, 630, and 640 are conductive line segments positioned in parallel at a same IC level and oriented in a driver pin direction equivalent to first direction 680. In some embodiments, driver pins 610, 620, 630, and 640 oriented in first direction 680 are driver pins 110, 120, 210, and 220, respectively, discussed above with respect to FIGS. 2A and 2B, positioned in parallel at driver pin level 180 and oriented in driver pin direction 150.

Driver pins 610 and 620 are a first plurality of driver pins, and driver pins 630 and 640 are a second plurality of driver pins. Driver pins 610 and 620 alternate with driver pins 630 and 640. In some embodiments, IC structure 600 includes one or more pluralities of driver pins (not shown) in addition to a first plurality of driver pins and a second plurality of driver pins. In some embodiments, IC structure 600 includes one or more pluralities of driver pins in which driver pins of each plurality of driver pins alternate with driver pins of the other one or more pluralities of driver pins.

First layer of metal segments 650A, 650B, 650C, and 650D includes four parallel metal segments oriented in second direction 690. Metal segments 650A and 650C are a first metal segment array of the first layer of metal segments, and metal segments 650B and 650D are a second metal segment array of the first layer of metal segments. Metal segments 650A and 650C alternate with metal segments 650B and 650D within the first layer of metal segments.

First via array 655-1 includes four vias, one via at each of the four locations at which metal segments 650A and 650C overlap driver pins 610 and 620. First via array 655-2 includes four vias, one via at each of the four locations at which metal segments 650B and 650D overlap driver pins 630 and 640.

Second layer of metal segments 660A, 660B, 660C, and 660D includes four parallel metal segments oriented in first direction 680. Metal segments 660A and 660C are a first metal segment array of the second layer of metal segments, and metal segments 660B and 660D are a second metal segment array of the second layer of metal segments. Metal segments 660A and 660C alternate with metal segments 660B and 660D within the second layer of metal segments.

Second via array 665-1 includes four vias, one via at each of the four locations at which metal segments 660A and 660C overlap metal segments 650A and 650C. Second via array 665-2 includes four vias, one via at each of the four locations at which metal segments 660B and 660D overlap metal segments 650B and 650D.

First layer of metal segments 650A, 650B, 650C, and 650D and second layer of metal segments 660A, 660B, 660C, and 660D are also described as a plurality of layers of metal segment arrays in which each layer includes a first metal segment array (650A and 650C, or 660A and 660C) and a second metal segment array (650B and 650D, or 660B and 660D). In some embodiments, a plurality of layers of metal segment arrays includes fewer than the two layers of the embodiment depicted in FIG. 6. In some embodiments, a plurality of layers of metal segment arrays includes layers (not shown) in addition to the two layers of the embodiment depicted in FIG. 6.

In some embodiments, a layer of a plurality of layers of metal segment arrays includes one or more metal segment arrays in addition to a first metal segment array and a second metal segment array. In some embodiments a layer of a plurality of layers of metal segment arrays includes two or more metal segment arrays in which metal segments of each plurality of metal segment arrays alternate with metal segments of the other one or more pluralities of metal segment arrays.

First via array 655-1 and second via array 665-1 are also described as a first plurality of via arrays. First via array 655-2 and second via array 665-2 are also described as a second plurality of via arrays. In some embodiments, a first or second plurality of via arrays includes one or more via arrays (not shown) in addition to the two via arrays of the embodiment depicted in FIG. 6.

In some embodiments, IC structure 600 includes one or more pluralities of via arrays (not shown) in addition to a first plurality of via arrays and a second plurality of via arrays.

Each routing line of routing lines 670A and 670B is a single line including a metal segment oriented in second direction 690 at a top level overlying second layer of metal segments 660A, 660B, 660C, and 660D. Additional portions of routing lines 670A and 670B are not shown in FIG. 6. Second layer of metal segments 660A, 660B, 660C, and 660D has a layer orientation of first direction 680, so the metal segments of routing lines 670A and 670B are oriented in a direction perpendicular to the layer direction of second layer of metal segments 660A, 660B, 660C, and 660D.

First pair of top level vias 675A is positioned at the two locations where routing line 670A overlaps second layer of metal segments 660A and 660C. Second pair of top level vias 675B is positioned at the two locations where routing line 670B overlaps second layer of metal segments 660B and 660D.

First routing line 670A and second routing line 670B are also described as a plurality of routing lines including first routing line 670A and second routing line 670B. In some embodiments, a plurality of routing lines includes routing lines (not shown) in addition to routing lines 670A and 670B depicted in FIG. 6.

In the embodiment depicted in FIG. 6, second layer of metal segments 660A, 660B, 660C, and 660D is a topmost layer of a plurality of layers of metal segment arrays. In some embodiments, a plurality of layers of metal segment arrays includes more than two layers, and a layer other than the second layer is the topmost layer of the plurality of layers of metal segment arrays.

In some embodiments, an IC structure 600 includes one or more additional layers of metal segments (not shown) overlying a topmost layer of a plurality of layers of metal segment arrays. The one or more additional layers of metal segments do not include each of the metal segment arrays of the plurality of layers of metal segment arrays. Accordingly, in some embodiments, a topmost layer of the one or more additional layers of metal segments is at a level above the topmost layer of the plurality of layers of metal segment arrays.

In some embodiments, a first routing line of a plurality of routing lines overlies a topmost layer of a plurality of layers of metal segment arrays, and a second routing line of the plurality of routing lines overlies a topmost layer of one or more additional layers of metal segments. In some embodiments, a first routing line of a plurality of routing lines and a second routing line of the plurality of routing lines are positioned at different levels and have different orientation directions. In some embodiments, a first routing line of a plurality of routing lines and a second routing line of the plurality of routing lines are positioned at different levels and have a same orientation direction.

In the various embodiments discussed above, first metal segment arrays of each layer of a plurality of layers of metal segment arrays, a first plurality of via arrays, and a first pair of top level vias are configured to electrically connect a first plurality of driver pins to a first routing line, and second metal segment arrays of each layer of the plurality of layers of metal segment arrays, a second plurality of via arrays, and a second pair of top level vias are configured to electrically connect a second plurality of driver pins to a second routing line.

In some embodiments, a first plurality of driver pins, first metal segment arrays of each layer of a plurality of layers of metal segment arrays, a first plurality of via arrays, a first pair of top level vias, and a first routing line are elements of a first net structure such as net structure 500, and a second plurality of driver pins, second metal segment arrays of each layer of the plurality of layers of metal segment arrays, a second plurality of via arrays, a second pair of top level vias, and a second routing line are elements of a second net structure such as net structure 500.

Figure 7:
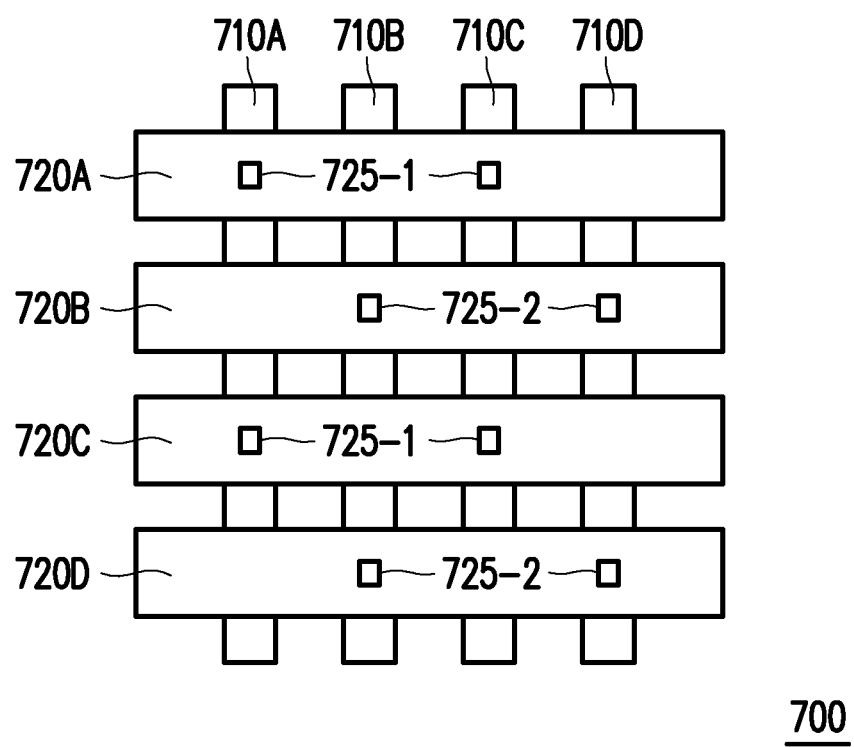
FIG. 7 is a diagram of an IC structure, in accordance with some embodiments.

FIG. 7 is a diagram of an IC structure 700, usable as a portion of IC structure 600, discussed above with respect to FIG. 6, in accordance with some embodiments. IC structure 700 includes metal segments 710A, 710B, 710C, and 710D positioned in parallel in a first layer of a plurality of layers of metal segment arrays, metal segments 720A, 720B, 720C, and 720D positioned in parallel in a second layer of the plurality of layers of metal segment arrays overlying the first layer, a first via array 725-1, and a second via array 725-2.

IC structure 700 has a configuration similar to that of IC structure 400A and includes the features of IC structures 400A and 400B, discussed above with respect to FIGS. 4A and 4B. In addition, as discussed below, IC structure 700 includes features in accordance with IC structure configurations as described above with respect to IC structure 600.

First via array 725-1 includes vias at locations where metal segments 720A and 720C overlap metal segments 710A and 710C and does not include vias at locations where metal segments 720B and 720D overlap metal segments 710B and 710D. Second via array 725-2 includes vias at locations where metal segments 720B and 720D overlap metal segments 710B and 710D and does not include vias at locations where metal segments 720A and 720C overlap metal segments 710A and 710C.

Metal segments 710A, 710C, 720A, and 720C are also described as a first plurality of metal segments. In some embodiments, a first plurality of metal segments includes metal segments (not shown) in addition to metal segments 710A, 710C, 720A, and 720C.

Metal segments 710B, 710D, 720B, and 720D are also described as a second plurality of metal segments. In some embodiments, a second plurality of metal segments includes metal segments (not shown) in addition to metal segments 710B, 710D, 720B, and 720D.

In some embodiments, IC structure 700 includes one or more pluralities of metal segments (not shown) in addition to a first plurality of metal segments and a second plurality of metal segments.

First via array 725-1 and second via array 725-2 are also described as a plurality of via arrays. In some embodiments, a plurality of via arrays includes via arrays (not shown) in addition to first via array 725-1 and second via array 725-2.

In the various embodiments discussed above, a first set of electrical connections includes a first plurality of metal segments and a first via array, and second set of electrical connections includes a second plurality of metal segments and a second via array. Each set of electrical connections is electrically isolated from other sets of electrical connections.

Figure 8:
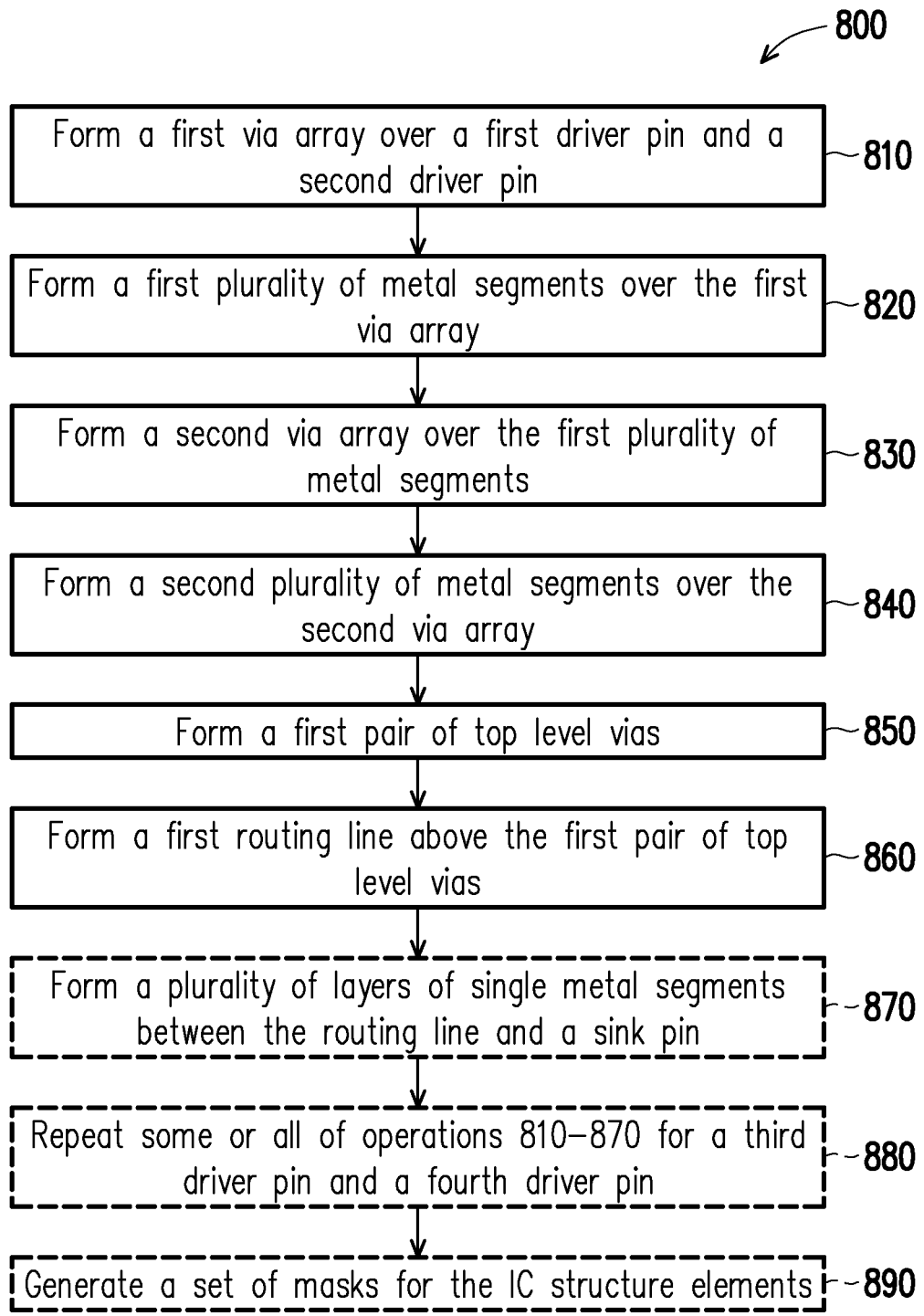
FIG. 8 is a flowchart of a method of forming an IC structure, in accordance with some embodiments.

FIG. 8 is a flowchart of a method 800 of forming an IC structure, in accordance with one or more embodiments. Method 800 is implemented to one or more of manufacture or design an IC structure such as IC structures 300, 400, 500, 600, and 700, discussed above with respect to FIGS. 3, 4, 5, 6, and 7, respectively.

If method 800 is performed to design an IC structure, method 800 is implemented by a processor configured to execute a set of computer-readable instructions that interface with a circuit design system to design and render a layout of an IC structure having the features discussed herein. In some embodiments, rendering a layout of an IC structure includes one or more of generating, modifying, or storing an electronic file. In some embodiments, method 800 is implemented in part or in whole by system 900, discussed below with respect to FIG. 9.

The sequence in which the operations of method 800 are depicted in FIG. 8 is for illustration only; the operations of method 800 are capable of being executed in sequences that differ from that depicted in FIG. 8. In some embodiments, operations in addition to those depicted in FIG. 8 are performed before, between and/or after the operations depicted in FIG. 8.

At operation 810, a first via array is formed over a first driver pin and a second driver pin. The first driver pin and the second driver pin are positioned in parallel at a driver pin level, and the first via array includes a first plurality of vias contacting the first driver pin and a second plurality of vias contacting the second driver pin.

In some embodiments, forming a first via array comprises forming a first via array over driver pins 110 and 120, discussed above with respect to IC structures 100 and 200. In some embodiments, forming a first via array comprises forming first via array 335 over driver pins 310 and 320, discussed above with respect to IC structure 300. In some embodiments, forming a first via array comprises forming first via array 655-1 over driver pins 610 and 620, discussed above with respect to IC structure 600.

At operation 820, a first plurality of metal segments is formed over the first via array. Each metal segment of the first plurality of metal segments is oriented perpendicularly to the first driver pin and the second driver pin, and contacts a via of the first plurality of vias and a via of the second plurality of vias.

In some embodiments, forming a first plurality of metal segments comprises forming first layer of metal segments 330, discussed above with respect to IC structure 300. In some embodiments, forming a first plurality of metal segments comprises forming metal segments 410A and 410B, discussed above with respect to IC structure 400A. In some embodiments, forming a first plurality of metal segments comprises forming metal segments 410A, 410B, and 410C, discussed above with respect to IC structure 400B. In some embodiments, forming a first plurality of metal segments comprises forming metal segments 650A and 650C, discussed above with respect to IC structure 600. In some embodiments, forming a first plurality of metal segments comprises forming metal segments 710A and 710C, discussed above with respect to IC structure 700.

At operation 830, a second via array is formed over the first plurality of metal segments, wherein each via of the second via array contacts a metal segment of the first plurality of metal segments.

In some embodiments, forming a second via array comprises forming second via array 345 over first layer of metal segments 330, discussed above with respect to IC structure 300. In some embodiments, forming a second via array comprises forming via array 425, discussed above with respect to IC structures 400A and 400B. In some embodiments, forming a second via array comprises forming second via array 665-1 over metal segments 650A and 650C, discussed above with respect to IC structure 600. In some embodiments, forming a second via array comprises forming via array 725-1, discussed above with respect to IC structure 700.

At operation 840, a second plurality of metal segments is formed over the second via array, wherein each metal segment of the second plurality of metal segments is oriented perpendicularly to the metal segments of the first plurality of metal segments, and contacts multiple vias of the second via array.

In some embodiments, forming a second plurality of metal segments comprises forming second layer of metal segments 340, discussed above with respect to IC structure 300.

In some embodiments, forming a second plurality of metal segments comprises forming metal segments 410A and 410B, discussed above with respect to IC structure 400A. In some embodiments, forming a second plurality of metal segments comprises forming metal segments 410A, 410B, and 410C, discussed above with respect to IC structure 400B. In some embodiments, forming a second plurality of metal segments comprises forming metal segments 420A and 420B, discussed above with respect to IC structures 400A and 400B.

In some embodiments, forming a second plurality of metal segments comprises forming metal segments 660A and 660C, discussed above with respect to IC structure 600.

In some embodiments, forming a second plurality of metal segments comprises forming metal segments 710A and 710C, discussed above with respect to IC structure 700. In some embodiments, forming a second plurality of metal segments comprises forming metal segments 720A and 720C, discussed above with respect to IC structure 700.

At operation 850, a first pair of top level vias is formed at a top level higher than a level of the second plurality of metal segments. In some embodiments, forming a first pair of top level vias comprises forming the first pair of top level vias directly on the second plurality of metal segments. In some embodiments, an IC structure includes one or more additional pluralities of metal segments above the second plurality of metal segments, and forming a first pair of top level vias comprises forming the first pair of top level vias directly on an additional plurality of metal segments above the second plurality of metal segments.

In some embodiments, forming a first pair of top level vias comprises forming pair of top level vias 375, discussed above with respect to IC structure 300. In some embodiments, forming a first pair of top level vias is part of forming plurality of vias 575, discussed above with respect to IC structure 500. In some embodiments, forming a first pair of top level vias comprises forming first pair of top level vias 675A, discussed above with respect to IC structure 600.

At operation 860, a first routing line is formed above, and in contact with, the first pair of top level vias. In some embodiments, forming a first routing line comprises forming routing line 370, discussed above with respect to IC structure 300. In some embodiments, forming a first routing line comprises forming routing line 570, discussed above with respect to IC structure 500. In some embodiments, forming a first routing line comprises forming first routing line 670A, discussed above with respect to IC structure 600.

Operations 810-860 thereby establish an electrical connection from the first routing line to the first driver pin and the second driver pin.

In some embodiments, forming each metal segment of the first plurality of metal segments at operation 820 and each metal segment of the second plurality of metal segments at operation 840 comprises forming a metal segment according to a set of default rules. In some embodiments, forming each metal segment of the first plurality of metal segments at operation 820 and each metal segment of the second plurality of metal segments at operation 840 comprises forming a metal segment having a minimum width according to a set of default rules.

In some embodiments, forming the first routing line at operation 860 comprises forming the first routing line having a width wider than a width defined by a set of default rules.

In some embodiments, at operation 870, a plurality of layers of single metal segments is formed between the routing line and a sink pin. In some embodiments, forming a plurality of layers of single metal segments comprises forming metal segments 550 and 560 between routing line 570 and sink pin 530, discussed above with respect to IC structure 500.

Operations 810-870 thereby establish an electrical connection from the first driver pin and the second driver pin to the sink pin.

In some embodiments, at operation 880, some or all of operations 810-870 are repeated for a third driver pin and a fourth driver pin. In some embodiments, operation 880 includes forming a third via array over a third driver pin and a fourth driver pin, the third driver pin and the fourth driver pin being positioned at the driver pin level and in parallel to the first driver pin and the second driver pin. The third via array comprises a third plurality of vias contacting the third driver pin, and a fourth plurality of vias contacting the fourth driver pin.

In some embodiments, forming a third via array comprises forming first via array 655-2 over driver pins 630 and 640, discussed above with respect to IC structure 600. In some embodiments, forming the first via array in operation 810 and the third via array in operation 880 comprises forming the first via array and the third via array over the first driver pin and the second driver pin alternating with the third driver pin and the fourth driver pin.

In some embodiments, operation 880 includes forming a third plurality of metal segments over the third via array. Each metal segment of the third plurality of metal segments is oriented perpendicularly to the third driver pin and the fourth driver pin, and contacts a via of the third plurality of vias and a via of the fourth plurality of vias.

In some embodiments, forming a third plurality of metal segments comprises forming metal segments 650B and 650D, discussed above with respect to IC structure 600. In some embodiments, forming a third plurality of metal segments comprises forming metal segments 710B and 710D, discussed above with respect to IC structure 700.

In some embodiments, operation 880 includes forming a fourth via array over the third plurality of metal segments. Each via of the fourth via array contacts a metal segment of the third plurality of metal segments.

In some embodiments, forming a fourth via array comprises forming second via array 665-2 over metal segments 650B and 650D, discussed above with respect to IC structure 600. In some embodiments, forming a fourth via array comprises forming via array 725-2, discussed above with respect to IC structure 700.

In some embodiments, operation 880 includes forming a fourth plurality of metal segments over the fourth via array. Each metal segment of the fourth plurality of metal segments is oriented perpendicularly to the metal segments of the third plurality of metal segments, and contacts multiple vias of the fourth via array.

In some embodiments, forming a fourth plurality of metal segments comprises forming metal segments 660B and 660D, discussed above with respect to IC structure 600. In some embodiments, forming a fourth plurality of metal segments comprises forming metal segments 710B and 710D, discussed above with respect to IC structure 700. In some embodiments, forming a fourth plurality of metal segments comprises forming metal segments 720B and 720D, discussed above with respect to IC structure 700.

In some embodiments, operation 880 includes forming a second pair of top level vias at the top level. In some embodiments, forming a second pair of top level vias is part of forming plurality of vias 575, discussed above with respect to IC structure 500. In some embodiments, forming a second pair of top level vias comprises forming second pair of top level vias 675B, discussed above with respect to IC structure 600.

In some embodiments, operation 880 includes forming a second routing line above, and in contact with, the second pair of top level vias. In some embodiments, forming a second routing line comprises forming routing line 570, discussed above with respect to IC structure 500. In some embodiments, forming a second routing line comprises forming second routing line 670B, discussed above with respect to IC structure 600.

Operation 880 thereby establishes an electrical connection from the second routing line to the third driver pin and the fourth driver pin.

In some embodiments, at operation 880, forming each metal segment of the third plurality of metal segments and each metal segment of the fourth plurality of metal segments comprises forming a metal segment according to a set of default rules. In some embodiments, at operation 880, forming each metal segment of the third plurality of metal segments and each metal segment of the fourth plurality of metal segments comprises forming a metal segment having a minimum width according to a set of default rules.

In some embodiments, forming the second routing line at operation 880 comprises forming the second routing line having a width wider than a width defined by a set of default rules.

In some embodiments, operation 880 includes forming a second plurality of layers of single metal segments between the second routing line and a second sink pin. In some embodiments, forming a second plurality of layers of single metal segments comprises forming metal segments 550 and 560 between routing line 570 and sink pin 530, discussed above with respect to IC structure 500.

In some embodiments, operation 880 thereby establishes an electrical connection from the third driver pin and the fourth driver pin to the second sink pin.

In some embodiments, operation 890 includes generating a set of masks for the IC structure elements formed in one or more of operations 810-880. In some embodiments, generating a set of masks is implemented in part or in whole by system 900, discussed below with respect to FIG. 9. In some embodiments, in operation 890, an IC structure is manufactured using the set of masks generated in operation 890.

Figure 9:
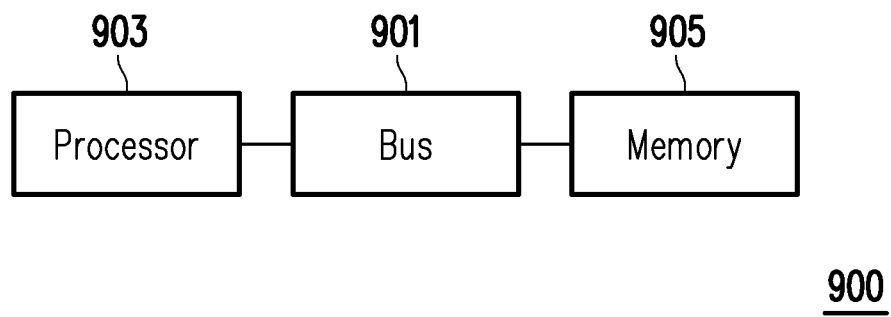
FIG. 9 is a functional block diagram of a computer or processor-based system upon which or by which at least one embodiment is implemented.

FIG. 9 is a functional block diagram of a computer or processor-based system 900 upon which or by which at least one embodiment is implemented.

Processor-based system 900 is programmable to generate layout files and/or masks usable for manufacturing an IC structure, as described herein, and includes, for example, bus 901, processor 903, and memory 905 components.

In some embodiments, the processor-based system is implemented as a single "system on a chip." Processor-based system 900, or a portion thereof, constitutes a mechanism for designing an IC structure. In some embodiments, the processor-based system 900 includes a communication mechanism such as bus 901 for transferring information and/or instructions among the components of the processor-based system 900. Processor 903 is connected to the bus 901 to obtain instructions for execution and process information stored in, for example, the memory 905. In some embodiments, the processor 903 is also accompanied with one or more specialized components to perform certain processing functions and tasks such as one or more digital signal processors (DSP), or one or more application-specific integrated circuits (ASIC). A DSP typically is configured to process real-world signals (e.g., sound) in real time independently of the processor 903. Similarly, an ASIC is configurable to perform specialized functions not easily performed by a more general purpose processor. Other specialized components to aid in performing the functions described herein optionally include one or more field programmable gate arrays (FPGA), one or more controllers, or one or more other special-purpose computer chips.

In one or more embodiments, the processor (or multiple processors) 903 performs a set of operations on information as specified by a set of instructions stored in memory 905 related to an IC structure configured to connect at least one driver pin to at least one sink pin. The execution of the instructions causes the processor to perform specified functions. In some embodiments, the processor (or multiple processors) 903 performs one or more of the operations of method 800, discussed above with respect to FIG. 8.

The processor 903 and accompanying components are connected to the memory 905 via the bus 901. The memory 905 includes one or more of dynamic memory (e.g., RAM, magnetic disk, writable optical disk, etc.) and static memory (e.g., ROM, CD-ROM, etc.) for storing executable instructions that when executed perform the steps described herein to generate an IC structure configured to connect at least one driver pin to at least one sink pin. In some embodiments, the memory 905 also stores data and/or electronic files associated with or generated by the execution of the operations of method 800, discussed above with respect to FIG. 8.

In one or more embodiments, the memory 905, such as a random access memory (RAM) or any other dynamic storage device, stores information including processor instructions for generating an IC structure configured to connect at least one power rail to at least one power strap. Dynamic memory allows information stored therein to be changed. RAM allows a unit of information stored at a location called a memory address to be stored and retrieved independently of information at neighboring addresses. The memory 905 is also used by the processor 903 to store temporary values during execution of processor instructions. In various embodiments, the memory 905 is a read only memory (ROM) or any other static storage device coupled to the bus 901 for storing static information, including instructions, that is not changed. Some memory is composed of volatile storage that loses the information stored thereon when power is lost. In some embodiments, the memory 905 is a non-volatile (persistent) storage device, such as a magnetic disk, optical disk or flash card, for storing information, including instructions, that persists even when power supplied to the memory 905 is turned off.

The term "computer-readable medium" as used herein refers to any medium that participates in providing information to processor 903, including instructions for execution. Such a medium takes many forms, including, but not limited to computer-readable storage medium (e.g., non-volatile media, volatile media). Non-volatile media includes, for example, optical or magnetic disks. Volatile media include, for example, dynamic memory. Common forms of computer-readable media include, for example, a floppy disk, a flexible disk, a hard disk, a magnetic tape, another magnetic medium, a CD-ROM, CDRW, DVD, another optical medium, punch cards, paper tape, optical mark sheets, another physical medium with patterns of holes or other optically recognizable indicia, a RAM, a PROM, an EPROM, a FLASH-EPROM, an EEPROM, a flash memory, another memory chip or cartridge, or another medium from which a computer can read. The term computer-readable storage medium is used herein to refer to a computer-readable medium.

In some embodiments, an IC structure includes a plurality of driver pins, each driver pin of the plurality of driver pins positioned at a driver pin level and oriented in a driver pin direction, and a plurality of layers of metal segment arrays, each layer of the plurality of layers of metal segment arrays having a layer direction and including two parallel metal segments oriented in the layer direction. The layer direction of a lowermost layer of the plurality of layers of metal segment arrays is perpendicular to the driver pin direction, the layer direction of each additional layer of the plurality of layers of metal segment arrays is perpendicular to the layer direction of a layer of the plurality of layers of metal segment arrays immediately below the additional layer of the plurality of layers of metal segment arrays, and each metal segment of a topmost layer of the plurality of layers of metal segment arrays is electrically connected to each driver pin of the plurality of driver pins.

In some embodiments, an IC structure includes a first plurality of driver pins and a second plurality of driver pins, each driver pin of the first plurality of driver pins and each driver pin of the second plurality of driver pins being positioned at a driver pin level and oriented in a driver pin direction, and a plurality of layers of metal segment arrays, each layer of the plurality of layers of metal segment arrays having a layer direction and including a first metal segment array and a second metal segment array, each metal segment array of the metal segment arrays comprising two parallel metal segments oriented in the layer direction. The layer direction of a lowermost layer of the plurality of layers of metal segment arrays is perpendicular to the driver pin direction, the layer direction of each additional layer of the plurality of layers of metal segment arrays is perpendicular to the layer direction of a layer of the plurality of layers of metal segment arrays immediately below the additional layer of the plurality of layers of metal segment arrays, each metal segment of the first metal segment array of a topmost layer of the plurality of layers of metal segment arrays is electrically connected to each driver pin of the first plurality of driver pins, and each metal segment of the second metal segment array of the topmost layer of the plurality of layers of metal segment arrays is electrically connected to each driver pin of the second plurality of driver pins.

In some embodiments, an IC structure includes a first metal one driver pin oriented in a driver pin direction, a second metal one driver pin oriented in the driver pin direction and aligned with the first metal one driver pin in an alignment direction perpendicular to the driver pin direction, a first metal two segment and a second metal two segment, each of the first metal two segment and the second metal two segment being oriented in the alignment direction and overlapping the first metal one driver pin and the second metal one driver pin, and a first routing line positioned in a layer above the first metal two segment and the second metal two segment. The first routing line is electrically connected to the first metal one driver pin by the first metal two segment and the second metal two segment and the second metal one driver pin by the first metal two segment and the second metal two segment.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit (IC) structure comprising:
   a plurality of driver pins, each driver pin of the plurality of driver pins positioned at a driver pin level, oriented in a driver pin direction, and electrically isolated from the other driver pins of the plurality of driver pins at the driver pin level; and
   a plurality of layers of metal segment arrays, each layer of the plurality of layers of metal segment arrays having a layer direction and comprising two parallel metal segments oriented in the layer direction,
   wherein
      the layer direction of a lowermost layer of the plurality of layers of metal segment arrays is perpendicular to the driver pin direction,
      the layer direction of each additional layer of the plurality of layers of metal segment arrays is perpendicular to the layer direction of a layer of the plurality of layers of metal segment arrays immediately below the additional layer of the plurality of layers of metal segment arrays, and each metal segment of a topmost layer of the plurality of layers of metal segment arrays is electrically connected to each driver pin of the plurality of driver pins.

2. The IC structure of claim 1, further comprising a functional circuit element positioned at a functional circuit level below the driver pin level, the functional circuit element configured to generate a signal on each driver pin of the plurality of driver pins.

3. The IC structure of claim 2, further comprising a sink pin at the driver pin level, wherein the IC structure is configured to conduct the signal from the topmost layer of the plurality of layers of metal segment arrays to the sink pin.

4. The IC structure of claim 3, further comprising a routing line overlying the topmost layer of the plurality of layers of metal segment arrays, the routing line configured to conduct the signal, wherein
each metal segment of the plurality of metal segment arrays has a width based on a default rule, and
the routing line has a width wider than a default rule width.

5. The IC structure of claim 1, wherein each metal segment of the lowermost layer of the plurality of layers of metal segment arrays is electrically connected to each driver pin of the plurality of driver pins by a single via.

6. The IC structure of claim 1, wherein,
each driver pin of the plurality of driver pins has a first endpoint and a second endpoint, and
at least one of the first endpoints or the second endpoints of the driver pins of the plurality of driver pins are aligned perpendicular to the driver pin direction.

7. The IC structure of claim 1, wherein the driver pin level comprises a metal one layer of the IC structure.

8. An integrated circuit (IC) structure comprising:
a first plurality of driver pins and a second plurality of driver pins, each driver pin of the first plurality of driver pins and each driver pin of the second plurality of driver pins being positioned at a driver pin level and oriented in a driver pin direction; and
a plurality of layers of metal segment arrays, each layer of the plurality of layers of metal segment arrays having a layer direction and comprising a first metal segment array and a second metal segment array, each metal segment array of the metal segment arrays comprising two parallel metal segments oriented in the layer direction, and the metal segments of the first metal segment array alternating with the metal segments of the second metal segment array,
wherein
the layer direction of a lowermost layer of the plurality of layers of metal segment arrays is perpendicular to the driver pin direction,
the layer direction of each additional layer of the plurality of layers of metal segment arrays is perpendicular to the layer direction of a layer of the plurality of layers of metal segment arrays immediately below the additional layer of the plurality of layers of metal segment arrays,
each metal segment of the first metal segment array of a topmost layer of the plurality of layers of metal segment arrays is electrically connected to each driver pin of the first plurality of driver pins,
each metal segment of the second metal segment array of the topmost layer of the plurality of layers of metal segment arrays is electrically connected to each driver pin of the second plurality of driver pins,
the first metal segment arrays of the plurality of layers of metal segment arrays are part of a first set of electrical connections, and
the second metal segment arrays of the plurality of layers of metal segment arrays are part of a second set of electrical connections electrically isolated from the first set of electrical connections.

9. The IC structure of claim 8, further comprising:
a first functional circuit element positioned at a functional circuit level below the driver pin level, the first functional circuit element configured to generate a first signal on each driver pin of the first plurality of driver pins; and
a second functional circuit element positioned at the functional circuit level, the second functional circuit element configured to generate a second signal on each driver pin of the second plurality of driver pins, the second signal being separate from the first signal.

10. The IC structure of claim 9, further comprising a first sink pin at the driver pin level and a second sink pin at the driver pin level, wherein the IC structure is configured to
conduct the first signal from the first metal segment array of the topmost layer of the plurality of layers of metal segment arrays to the first sink pin, and
conduct the second signal from the second metal segment array of the topmost layer of the plurality of layers of metal segment arrays to the second sink pin.

11. The IC structure of claim 10, further comprising:
a first routing line overlying the first metal segment array of the topmost layer of the plurality of layers of metal segment arrays, the first routing line configured to conduct the first signal, and
a second routing line overlying the second metal segment array of the topmost layer of the plurality of layers of metal segment arrays, the second routing line configured to conduct the second signal,
wherein
each metal segment of the plurality of layers of metal segment arrays has a width based on a default rule, and
each routing line of the first routing line and the second routing line has a width wider than a default rule width.

12. The IC structure of claim 8, wherein
each metal segment of the first metal segment array of the lowermost layer of the plurality of layers of metal segment arrays is electrically connected to each driver pin of the first plurality of driver pins by a single via, and
each metal segment of the second metal segment array of the lowermost layer of the plurality of layers of metal segment arrays is electrically connected to each driver pin of the second plurality of driver pins by a single via.

13. The IC structure of claim 8, wherein,
each driver pin of the first plurality of driver pins and the second plurality of driver pins has a first endpoint and a second endpoint, and
at least one of the first endpoints or the second endpoints of the driver pins of the first plurality of driver pins and the second plurality of driver pins are aligned perpendicular to the driver pin direction.

14. An integrated circuit (IC) structure comprising:
a first metal one driver pin oriented in a driver pin direction at a driver pin level;
a second metal one driver pin oriented in the driver pin direction at the driver pin level, aligned with the first metal one driver pin in an alignment direction perpendicular to the driver pin direction, and electrically isolated from the first metal one driver pin at the driver pin level;
a first metal segment and a second metal segment, each of the first metal segment and the second metal segment being oriented in the alignment direction and overlapping the first metal one driver pin and the second metal one driver pin; and
a first routing line positioned in a layer above the first metal segment and the second metal segment,
wherein the first routing line is electrically connected to
the first metal one driver pin by the first metal segment and the second metal segment, and
the second metal one driver pin by the first metal segment and the second metal segment.

15. The IC structure of claim 14, wherein the routing line comprises a plurality of metal segments having a plurality of orientation directions.

16. The IC structure of claim 14, wherein
each of the first metal segment and the second metal segment has a width corresponding to a first default rule width, and
the first routing line has a width wider than a second default rule width.

17. The IC structure of claim 14, wherein
the IC structure is part of an IC net structure comprising
a sink pin electrically connected to the first routing line, and
the first metal segment and the second metal segment are part of a mesh array of the IC net structure.

18. The IC structure of claim 14, further comprising:
a third metal one driver pin;
a fourth metal one driver pin;
a third metal segment;
a fourth metal segment; and
a second routing line,
wherein
at least one of the third metal one driver pin or the fourth metal one driver pin is positioned between the first metal one driver pin and the second metal one driver pin,
at least one of the third metal segment or the fourth metal segment is positioned between the first metal segment and the second metal segment,
the second routing line is electrically connected to the third metal one driver pin by the third metal segment and the fourth metal segment, and
the second routing line is electrically connected to the fourth metal one driver pin by the third metal segment and the fourth metal segment.

19. The IC structure of claim 18, wherein the first routing line and the second routing line are positioned in a same metal layer.

20. The IC structure of claim 18, wherein
the first routing line is positioned in a first metal layer, and
the second routing line is positioned in a second metal layer different from the first metal layer.

* * * * *